United States Patent [19]
Arbel

[11] Patent Number: 5,410,271
[45] Date of Patent: Apr. 25, 1995

[54] NON-LINEAR FEEDBACK NETWORK PROVIDING A LINEAR TRANSFER FUNCTION

[75] Inventor: Arieh Arbel, Haifa, Israel

[73] Assignee: Dan Inbar, Haifa, Israel

[21] Appl. No.: 61,559

[22] Filed: May 17, 1993

[51] Int. Cl.⁶ .............................................. H03F 1/34
[52] U.S. Cl. ................................. 330/110; 330/260; 330/282
[58] Field of Search ................. 330/86, 59, 110, 260, 330/282, 308

[56] References Cited

U.S. PATENT DOCUMENTS

| | | | |
|---|---|---|---|
| 4,422,051 | 12/1983 | Katakura et al. | 330/260 X |
| 4,454,478 | 6/1984 | Yokoyama | 330/260 X |
| 4,902,982 | 2/1990 | Moore et al. | 330/110 X |
| 5,256,986 | 10/1993 | Flocke et al. | 330/308 X |

FOREIGN PATENT DOCUMENTS

| | | | |
|---|---|---|---|
| 3099505 | 4/1991 | Japan | 330/282 |
| 4117710 | 4/1992 | Japan | 330/282 |
| 4274607 | 9/1992 | Japan | 330/282 |
| 2107948 | 5/1983 | United Kingdom | 330/282 |

OTHER PUBLICATIONS

Arbel, Arie F., "Analog Signal Processing and Instrumentation." pp. 3-5, 29-31, Cambridge University Press, 1980.

Arbel, Arie F., "Output for Curent-Mode Feedback Amplifiers, Theory and Applications" pp. 243-255, Mar. 1992.

Primary Examiner—James B. Mullins
Attorney, Agent, or Firm—Sandler, Greenblum & Bernstein

[57] ABSTRACT

A feedback network for linear operational amplifiers comprising n+1 identical non-linear devices which nonetheless yield a linear gain.

16 Claims, 10 Drawing Sheets

NON-LINEAR FEEDBACK NETWORK PROVIDING A LINEAR TRANSFER FUNCTION

FIELD OF INVENTION

The present invention relates generally to feedback networks employed in order to stabilize the gain of linear operational amplifiers well known in the art and particularly to intergrated circuit (IC) type current mode operational amplifiers.

BACKGROUND OF THE INVENTION

Figure 1:
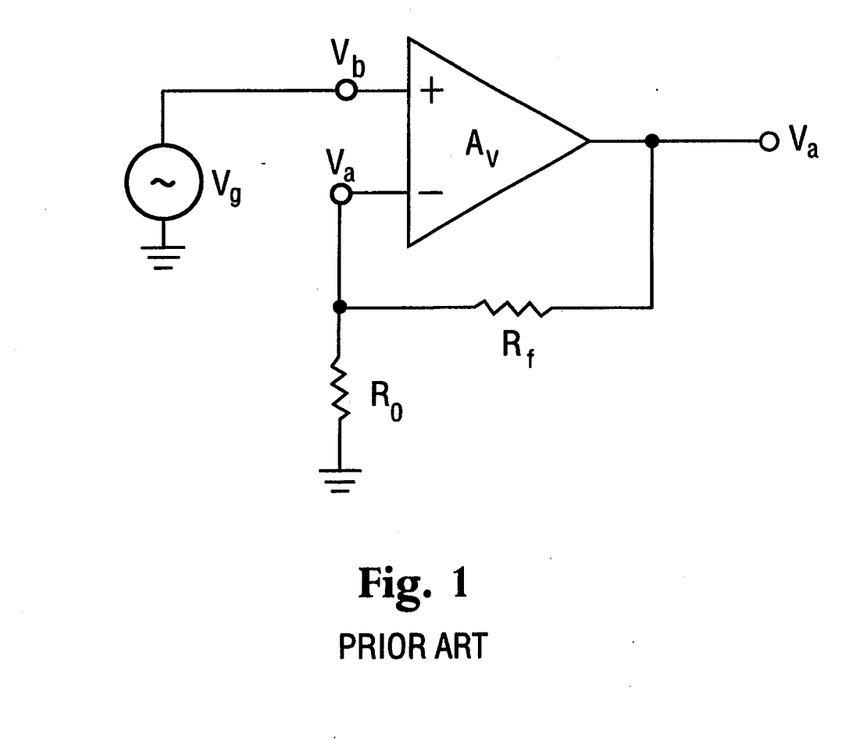
FIG. 1 is a schematic block diagram of a conventional VMA (voltage-mode operational amplifier)

Chapter 1 of the book "Analog Signal Processing and Instrumentation", by Arie Arbel, Cambridge University Press, 1980 discusses both voltage-mode and current-mode operational amplifiers. FIG. 1 attached hereto shows a typical voltage-mode feedback stabilized amplifier comprising a basic amplifier and a feedback network consisting of resistors Rf and Ro operating in the voltage mode. Its transfer-function approaches vo/vg=(1+Rf/Ro), if the voltage gain Av of the basic amplifier approaches infinity. Hence, gain accuracy depends upon the capability to obtain an accurate ratio between two linear, passive impedances, usually resistors and to maintain this ratio over the range of operating temperatures. The presence of resistors complicates the manufacture of integrated circuits. However, resistors are linear components and lead to desired linear transfer functions from operational amplifiers.

Figure 2:
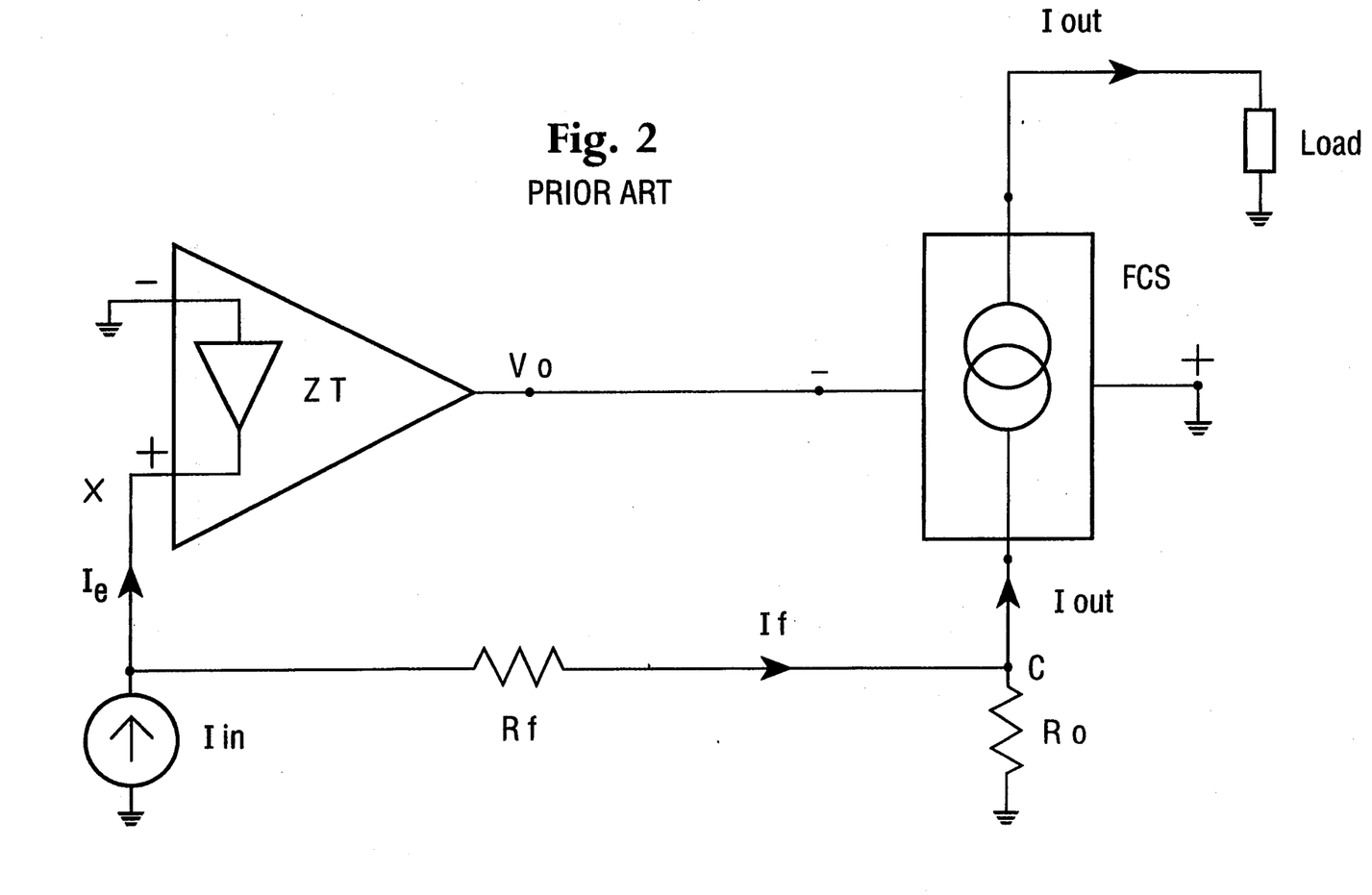
FIG. 2 is an example of a schematic block diagram of a conventional CMA (current-mode operational amplifier)

FIG. 2 shows a recent version of current mode single ended feedback stabilized operational amplifier (CMA). By "single ended" a single input and a single output is meant. This distinguishes from a differential amplifier having two outputs of opposite phase. The CMA employs a current mode output stage (COS) such as an FCS (floating current source) or a CCII (class II current conveyor) as the output stage. The FCS is a novel building block employed in analog current mode circuit design, described in the paper "Output Stage for Current-Mode Feedback Amplifiers, Theory and Application", Arie F. Arbel and Lavy Goldminz, Analog Integrated Circuits and Signal Processing, 2, (3) (1992), pp. 243–255. Both the FCS and the CCII are characterized by the fact that the current Iout entering the first current output terminal equals the current Iout flowing out of the second current output terminal. Both are novel building blocks in analog current-mode circuit design which are described in the paper entitled "Output Stage for Current-Mode Feedback Amplifiers, Theory and Application" by A. Arbel at al., *Analog Integrated Circuits and Processing* 2, (3) 1992, pp 243–255. The basic amplifier as an example is shown in FIG. 2 as a transimpedance amplifier ZT driving a COS, whose two outputs are connected to the output terminal and to the feedback network, respectively. The output terminal is connected to ground through a load.

The voltage or current transfer function, respectively, for infinite basic amplifier gain, is (for both kinds of feedback amplifiers): (1+Rf/Ro). Note, that the relationship between FIGS. 1 and 2 is governed by the law of duality: The input impedance of the ideal basic voltage amplifier in FIG. 1 is infinite, whereas that of the ideal basic current amplifier in FIG. 2, consisting of the transimpedance amplifier ZT in series with the transconductance of the FCS, is zero. The input current of the ideal basic voltage amplifier (i.e., voltage gain Av=infinity) equals zero, whereas the voltage at the input terminal X of the ideal basic current amplifier (i.e, currant gain Ai=infinity), is zero as well. In FIG. 1, the two feedback resistors Rf and Ro are in series, whereas in FIG. 2 they are in parallel (dc wise) as far as dc voltages are concerned. Resistor Rf will be identified as the feedback resistor and resistor Ro as the gain setting resistor.

SUMMARY OF THE INVENTION

It is an object of the present invention to provide an alternative for the passive linear resistors employed conventionally as feedback elements, which stabilize the gain of CMA's (current-mode operational amplifiers). Inclusion of passive resistors in an IC complicates the manufacturing procedure. In accordance with a preferred embodiment of the present invention, n+1 identical non-linear elements may be substituted for these resistors in order to obtain a current gain, Ai of n+1. (where n is the number of active elements used instead of the resistors and n=0,1,2...) Active elements are present in an IC anyway, and the absence of resistors simplifies the manufacturing process significantly. There is also provided a unique system when the feedback network is comprised of unidirectional active elements for feeding it from a modified FCS or class II current conveyor, i.e., a CCII- in such a way, that the current flowing through these active elements does not reverse polarity—although the output current derived from the FCS does reverse polarity.

Additionally, a method is provided by which the feedback elements may be electronically trimmed by applying external voltages to chosen terminals of the active devices, in order to compensate for the spread in their characteristic due to manufacturing tolerances and to thereby increase the gain accuracy. Furthermore, these external voltages may also be chosen such as to completely cut off m active elements, thereby reducing the gain of the current amplifier to 1+n−m. Hence, these external voltages may provide a fine and a coarse gain control. In addition, the output signal of such a current amplifier may be modulated by applying to some of these voltages an analog signal which varies as a function of a chosen parameter (time, current or voltage), thereby producing a variety of non-linear transfer functions.

BRIEF DESCRIPTION OF THE DRAWINGS

The present invention will be best understood and appreciated more fully from the following detailed description taken in conjunction with the following drawings in which.

DETAILED DESCRIPTION

In FIG. 2, Ie is the error current which approaches zero when the gain of the basic amplifier comprising ZT and an COS approaches infinity. The current If is the feedback current flowing through the resistor Rf. The current Iout is the total current flowing through the feedback network, which also equals the output current Iout flowing through the load.

Figure 3:
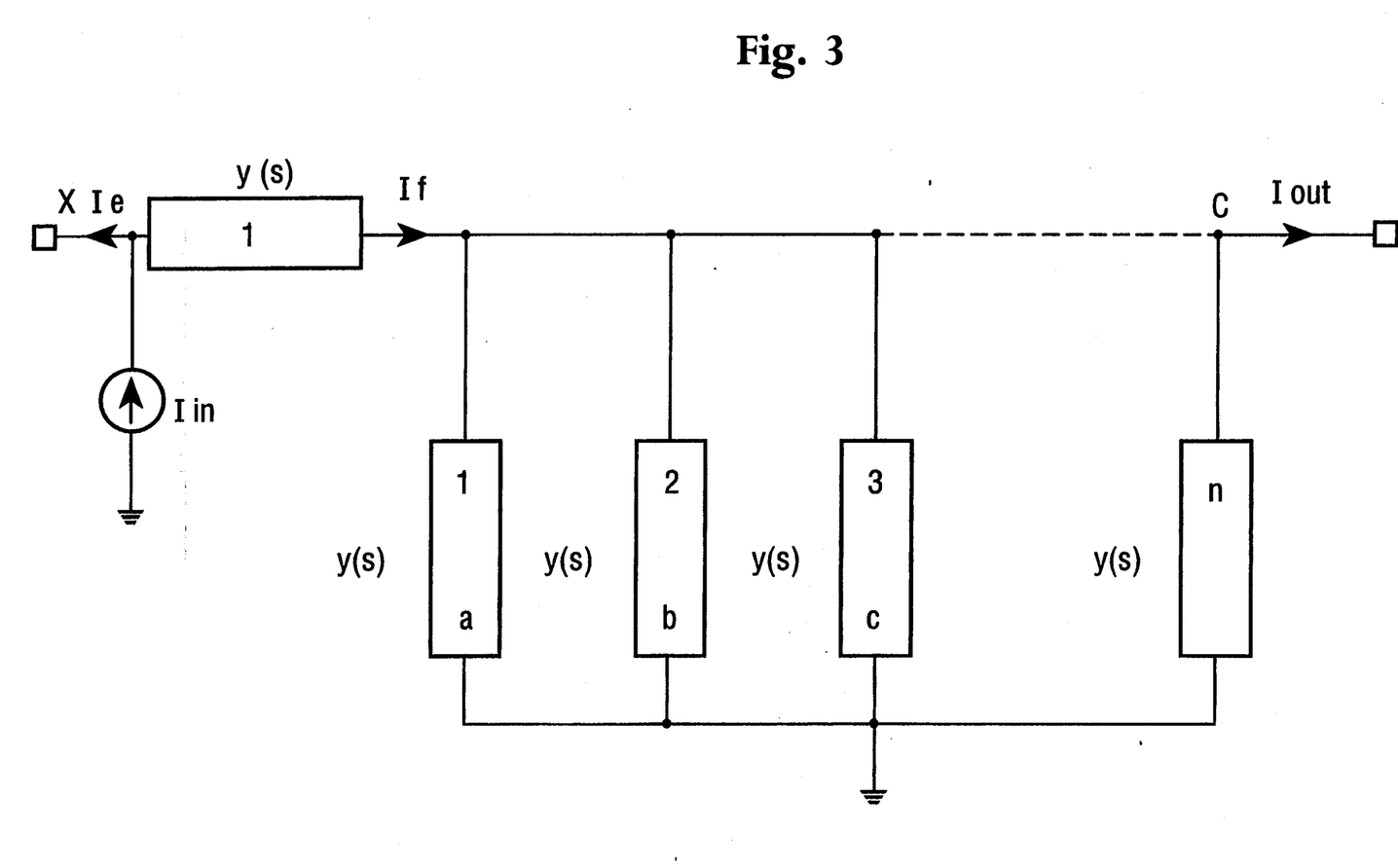
FIG. 3 is a block diagram showing of the identical non-linear devices, replacing the feedback resistor Rf and the gain-setting resistor Ro shown in FIG. 2.
Figure 4:
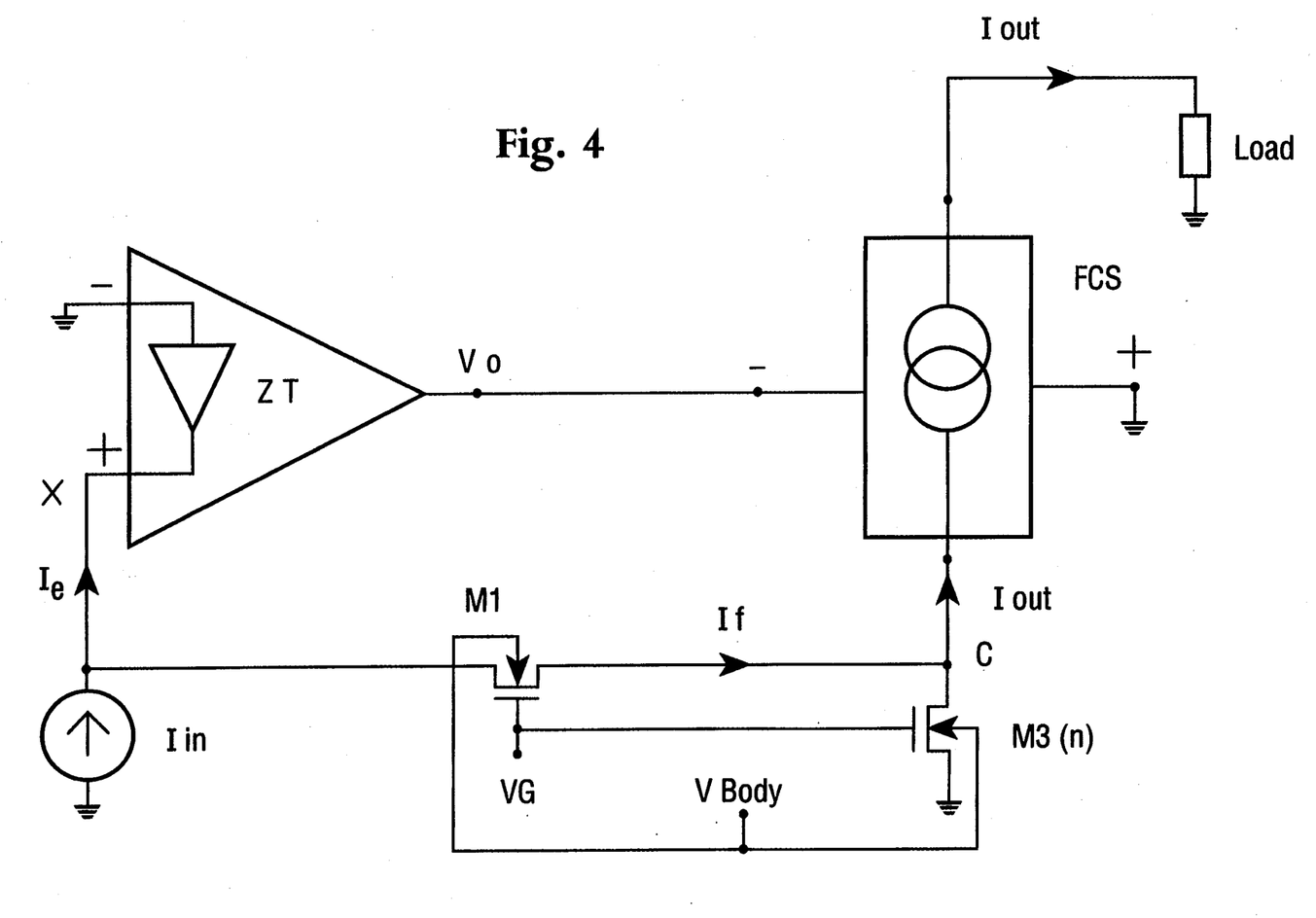
FIG. 4 is a schematic showing of a CMA equipped with n+1 identical non-linear devices serving as feedback elements, more particularly a single MOS-FET M1 replacing the feedback resistor Rf and n identical MOS-FET's Ma, Mb, Me, ... M, in parallel, replacing the gain setting resistor Ro shown in FIG. 2.

In FIG. 3, y(s) is the admittance replacing the feedback resistor Rf of FIG. 2. It in effect also is the admittance of each of the non-linear devices replacing Ro. Thus the admittance of devices 1, 2 ...n are each equal to y(s) which is equal to the admittance of the device replacing Rf. Reference is now made to FIG. 4, in which N-Channel FETs (field effect transistors) are substituted as non-linear devices for the resistors of the resistive feedback network shown in FIG. 2. For ease of depiction, n parallel connected transistors which replace resistors a-n of FIG. 2 are shown as a single FET. Each FET is a non-linear device having four terminals, a source terminal a body terminal, a drain terminal, a body terminal and a gate terminal.

The current transfer function for infinite gain of the basic amplifier is $A_i = 1 + (nY(s)/Y(s)) = 1 + n$, where Y(s) is the complex admittance measured between drain and source of a single one of the identical FETs. This amplification is not a function of frequency, such that the gain of the amplifier is frequency independent.

For the circuit of FIG. 4, since the respective terminals of all of the FETs are connected to the same voltage, the FETs all operate at same conditions. This is clearly true of the parallel connected devices. It is also true of the single device which replaces $R_1$ of FIG. 2 since the leftmost terminal of this device is connected to the negative input of $Z_T$. As is well known in the art, this terminal is a "virtual ground" and its voltage is very nearly zero, as are the voltages of the corresponding terminals of the parallel connected devices. Thus while the admittance of individual devices may be a function of frequency, the gain of the amplifier $A_i = 1 + (nY(s)/Y(s)) = 1 + n$ is independent of both the operating point of the FETs (and thus of the output of the amplifier) and of the frequency of operation.

The FET devices as is well known have a gate terminal to which a voltage VG is applied, a bulk or body terminal at voltage VB, a drain D and a source S. Chapter 2.5, pages 106–112 of the book "Bipolar and MOS Analog Integrated Circuit Design" by Alan B. Grebene, John Wiley & Sons, 1984 describes the electrical characteristic of N- and P-channel enhancement and depletion MOS-FET's. There it is shown, that these devices may be operated either in the "triode" region or in the "saturated" or "pinched off" region, depending upon the relative value between the voltages VS, VG, VD and VB applied to the Source, Gate, Drain and Body (or Bulk). See for example FIG. 2.41 of Grebene et al on page 107, op cit. In the triode region, the Drain current increases proportionally to an increase in Drain voltage. Overall, the proportionality is nonlinear. In the pinched region, the Drain current remains roughly constant if the Gate voltage is constant as the Drain voltage increases. If the Gate and Drain are interconnected, it is well known in the art that the transistor behaves as a non-linear resistance whose value equals 1/Gm, where Gm is the channel conductance.

One preferred embodiment of the invention replaces the resistors shown in FIG. 2 by the channel resistance. The channel resistance is the inverse of the channel conductance, between the Source and the Drain of MOS-FET's operating in the triode region, as given by $$gc(x) = usCox(Vgs - V(x) - Vth)$$

where: gc(x) is the conductance as a function of the distance x along the channel from the Drain;
  us = the surface mobility of the majority carriers in the induced channel;
  Cox = capacitance per unit area of the Gate electrode;
  Vgs = the net Gate voltage;
  V(x) = the channel potential at a distance x from the Source; and
  Vth = a threshold voltage.

This is the equation (2.46) on page 109 of the above mentioned reference. This region of operation is ensured, if the condition VG > VDmax + VTH is satisfied. VTH is the threshold voltage at which the Drain current becomes substantially constant; that is, if Vgs is increased above the threshold voltage Vth, the p-type region directly below the Gate would invert to its conductivity type and form an n-type channel. The triode region is characterized by the fact, that VC, the voltage at node C, may change polarity. Since for an N-channel transistor VD > VS must always be satisfied, the drain becomes the source and source becomes the drain for VC < 0.

Figure 5A:
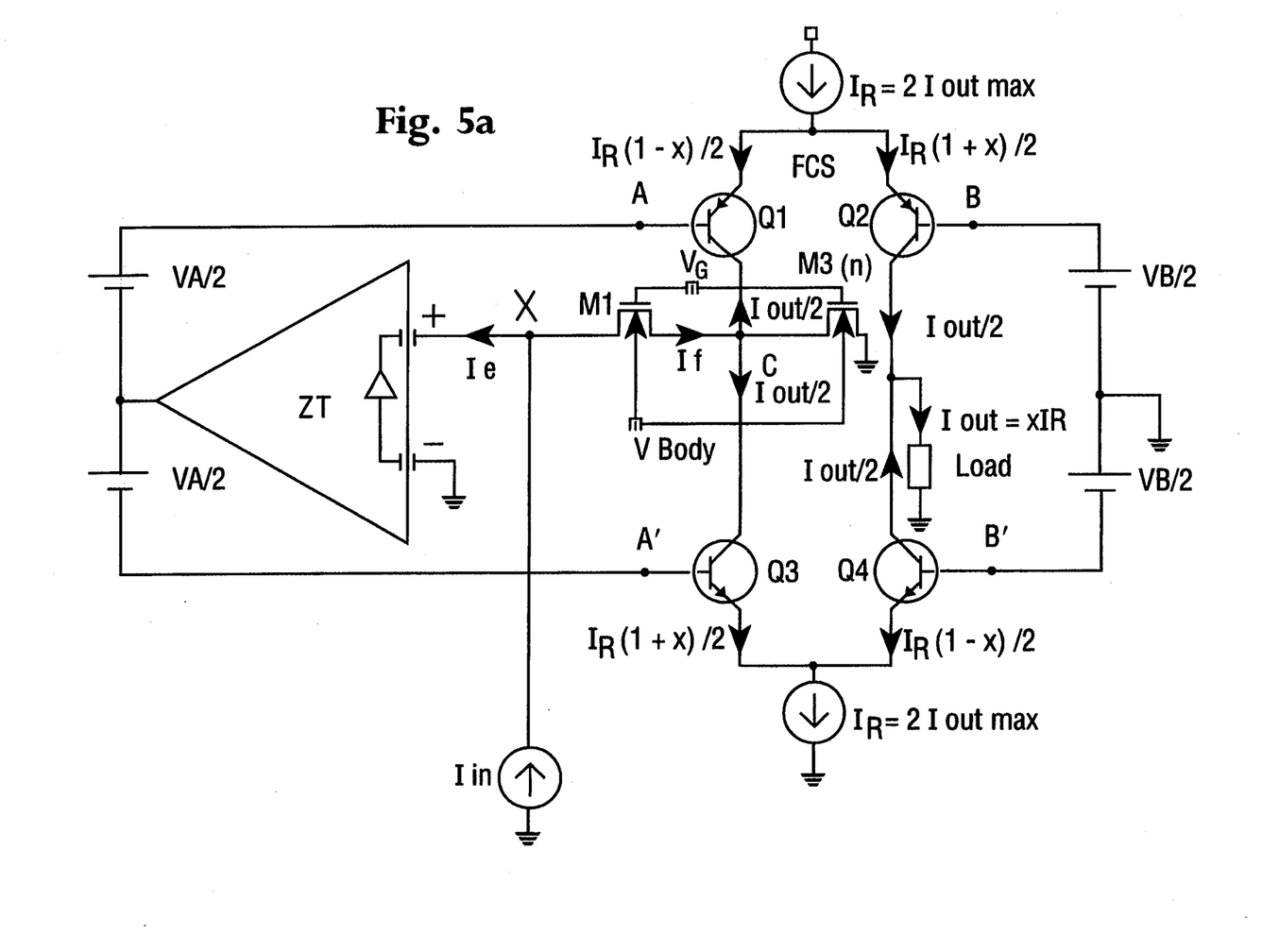
FIG. 5a is a schematic of a CMA equipped with a COS connected as an FCS feeding a feedback network, which comprises N-channel MOS-FET's. (The value VG of their Gate voltage has been chosen such as to ensure that they are operating in the triode region.)

FIG. 5a shows a CMA equipped with such a feedback network, in which the gates of all MOS-FET transistors forming the feedback network are connected to a dc voltage VG satisfying the condition for triode operation. It will also be appreciated, by those skilled in the art, that dc conditions for the PCS feeding the feedback network must ensure that the dc voltage VA applied between the base nodes A and A' of the bipolar transistors Q1 and Q3 is approximately equal to VB applied between the base nodes B and B' of bipolar transistors Q2 and Q4, respectively.

In an alternative embodiment of the invention, the drains of the FET's forming the feedback network are connected to the gates, which ensures that they operate in the pinched-off region. However, unlike in the triode mode of operation, this connection makes the value of VGS signal dependent. Therefore, VGS must be prevented from ever becoming less that VTH, because in that case the MOS-FET would enter the cut off region. Hence, the current flowing through the device must never become zero and two feedback network branches must be provided, each corresponding to Rf and Ro in FIG. 2, one for each direction of current.

Figure 5B:
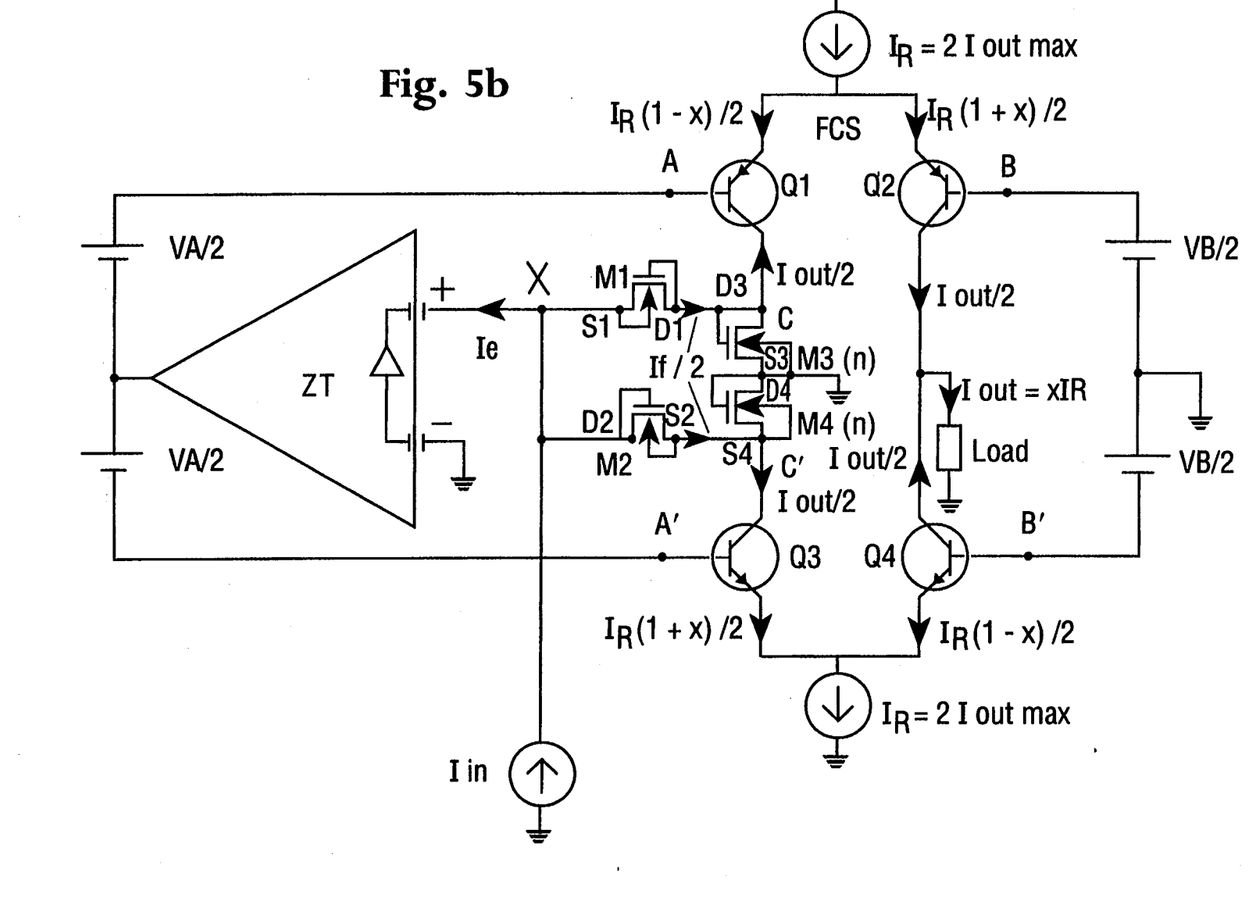
FIG. 5b is the schematic of a CMA equipped with a COS connected as an FCS feeding a feedback network, whose N-channel transistors operate in the saturated region. To ensure this, their Drains and Gates are connected together. Hence, unlike in the circuit shown in FIG. 5a the Drain current which in an N-channel MOSFET must always flow from Drain to Source, can never reverse polarity. This requires two separate feedback branches which are fed separately from the collectors of Q1 and Q3, as shown.

FIG. 5b shows a CMA equipped with such a feedback network consisting of MOS-FET's operating in the pinched off region, driven by a modified FCS output stage. As mentioned above, the feedback network consists of two branches, each formed by n+1 transistors. The circuit of the FCS shown in FIG. 5b feeds the two above mentioned feedback branches: Q1 of the FCS feeds M1 and n transistors M3 in parallel; and Q3 feeds M2 and n transistors M4 in parallel. This ensures, that the current feeding each branch varies between $|0.25\, \text{Iref}|$ and $|0.75\, \text{Iref}|$ over the full range of $-0.5\, \text{Iref} < \text{Iout} < 0.5\, \text{Iref}$, and that VGS is always greater than VTH. Iref is the reference current feeding the FCS, indicated in the drawings as I subscript R.

Figure 6A:
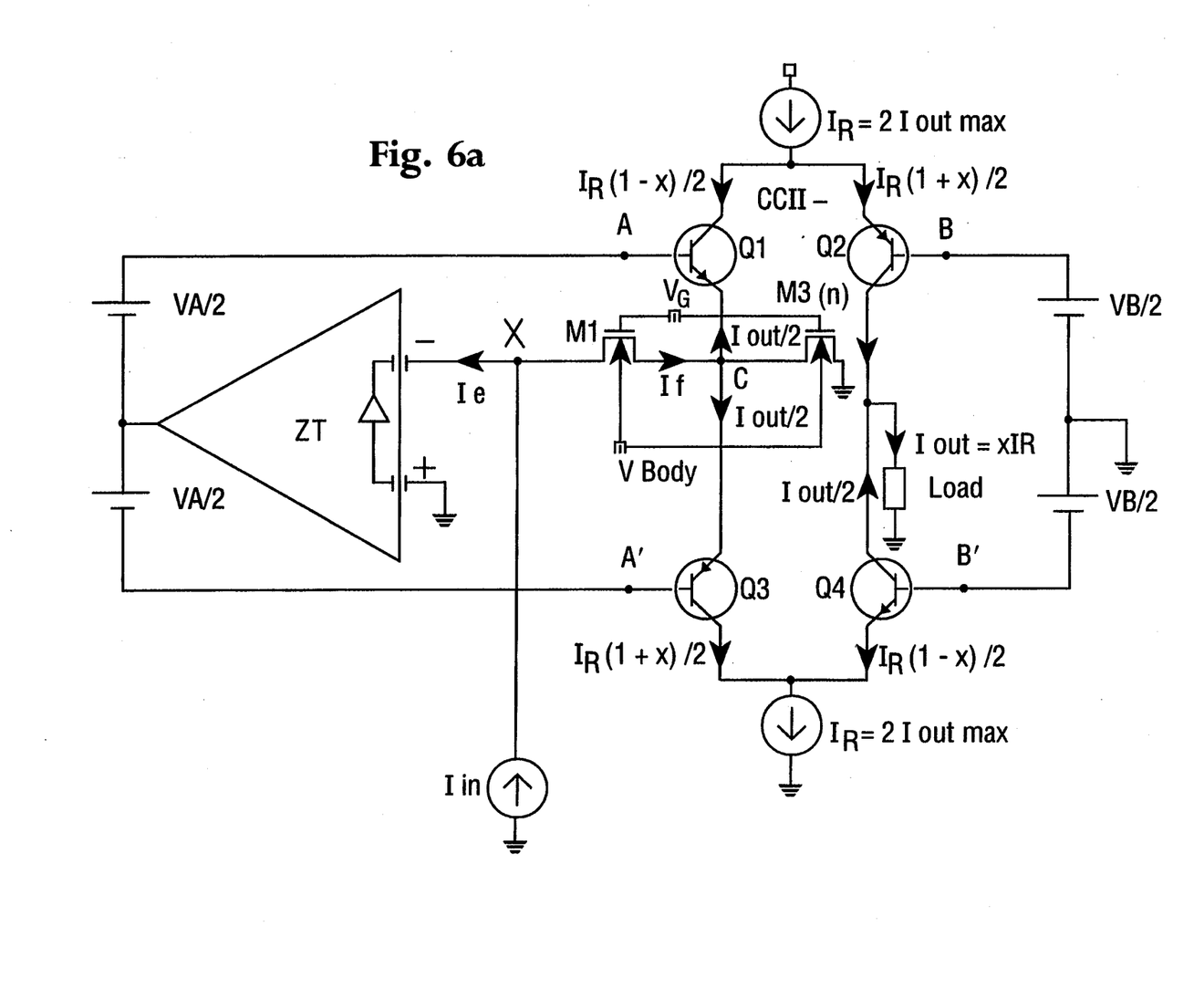
FIG. 6a shows a CMA equipped with the same kind of feedback network as shown in FIG. 5a but fed by a COS connected as a CCII-.
Figure 6B:
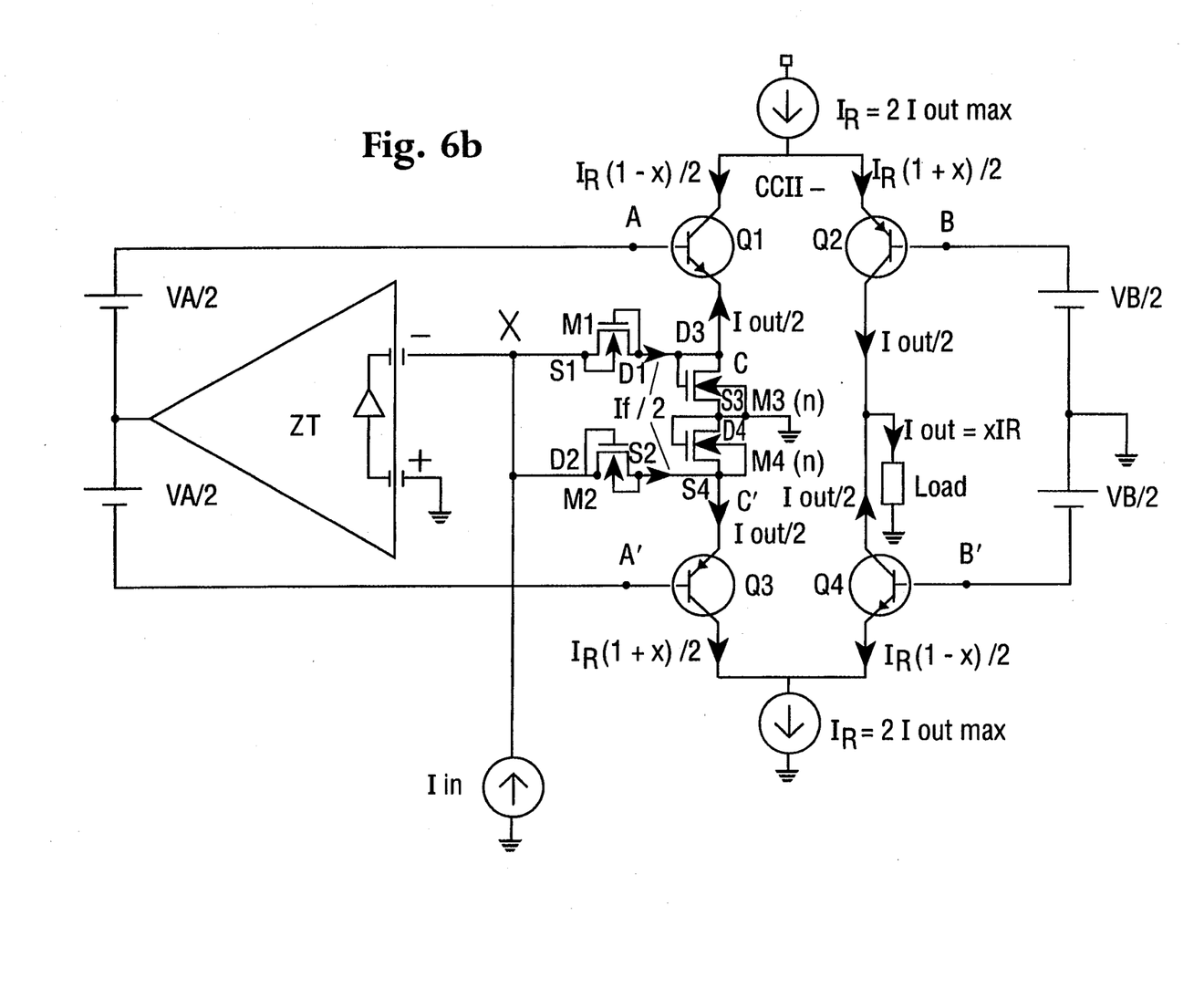
FIG. 6b shows a CMA equipped with the same kind of feedback network as shown in FIG. 5b, but fed by an COS connected as a CCII-.

FIGS. 6a and 6b show two CMA's equipped with the same feedback networks as shown in FIGS. 5a and 5b. However, the feedback networks are driven by a CCII-output stage also described in the paper "Output Stage for Current-Mode Feedback Amplifiers, Theory and Applications", op. cit. Here, Q1 and Q3 serve as emitter-followers driving the same feedback networks as shown in FIGS. 5a and 5b, respectively. Hence, Q1 with Q2 and Q3 with Q4 form a folded cascode, which among other benefits also relaxes the dc conditions from VB=VA to VB>VA.

In all FIGS. 5 and 6, the Body of individual field effect transistors may be connected to separate voltages differing only a little from the original one's, in order to make their channel resistance slightly different from the others. Such separate voltages may also be applied to individual Gates in FIGS. 5a and 6a. By such an arrangement, the transconductance of chosen transistors may be trimmed by varying the corresponding external voltages, in order to compensate for the spread in transistor parameters due to manufacturing tolerances.

In FIGS. 5a and 6a, the gates of m individual transistors may be connected by an external switching arrangement to two alternative voltages VG1 and VG2 which satisfy VG1>VDmax+VTH and VG2<VDmin+VTH, respectively, the latter inequality being the condition for the corresponding transistor to be cut off. It follows, that the gain is abruptly changed from 1+n to 1+n−m, which is in effect a coarse gain control.

Each branch in FIGS. 5 and 6 contains n+1 identical devices, which are shown here as N-channel transistors. However, each branch may also contain n+1 P-channel transistors. It follows, that in FIG. 5a and 6a transistors M1 and M3 may be replaced by P-channel transistors, and that one N-channel branch and another P-channel branch is a possible combination for the feedback networks shown in FIGS. 5b and 6b, which consist of two branches. In both above mentioned modes of operation, the transistors act as non-linear two-terminal devices of complex impedance.

Figure 7A:
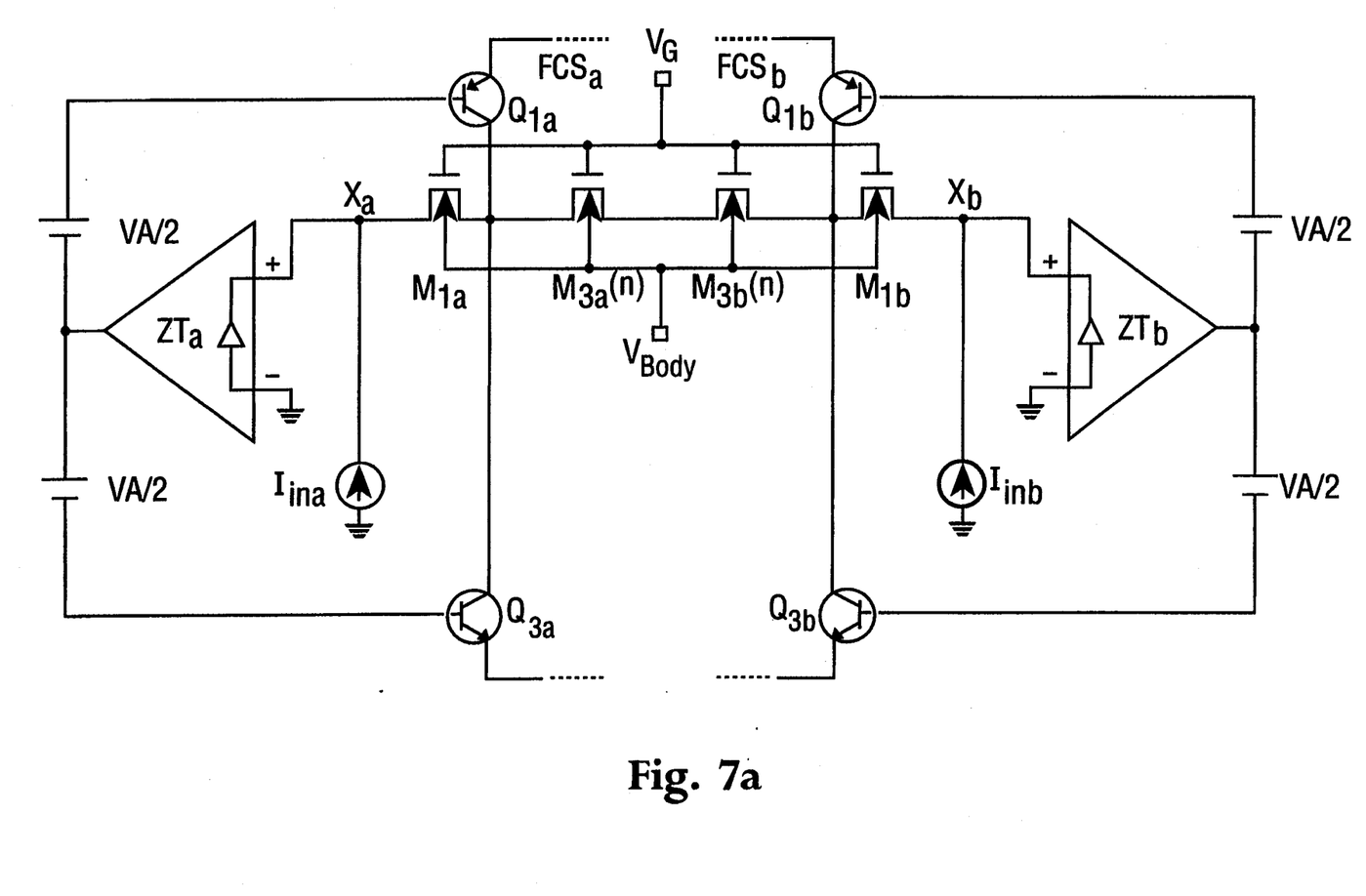
FIG. 7a shows a feedback network of the kind employed in FIG. 5a, modified to be employed with a differential CMA.

The feedback network shown in FIG. 5a may be modified to be employed with a differential CMA such as described in the paper "Feasibility Study of Current Mode Differential Amplifier Design", Lavy Goldminz and Arie Arbel, Proceedings ISCAS 1992, San Diego, pp. 2856-2859. Such a differential amplifier comprises essentially two halfs, each consisting of a single ended amplifier such as the one shown in FIGS. 5 and 6. FIG. 7a shows such a differential topology, in which elements corresponding to those appearing in FIG. 5a appear twice and are accordingly indexed as a and b. The feedback network shown in FIG. 5b may also be modified to be employed with a differential CMA as shown in FIG. 7b.

Figure 7B:
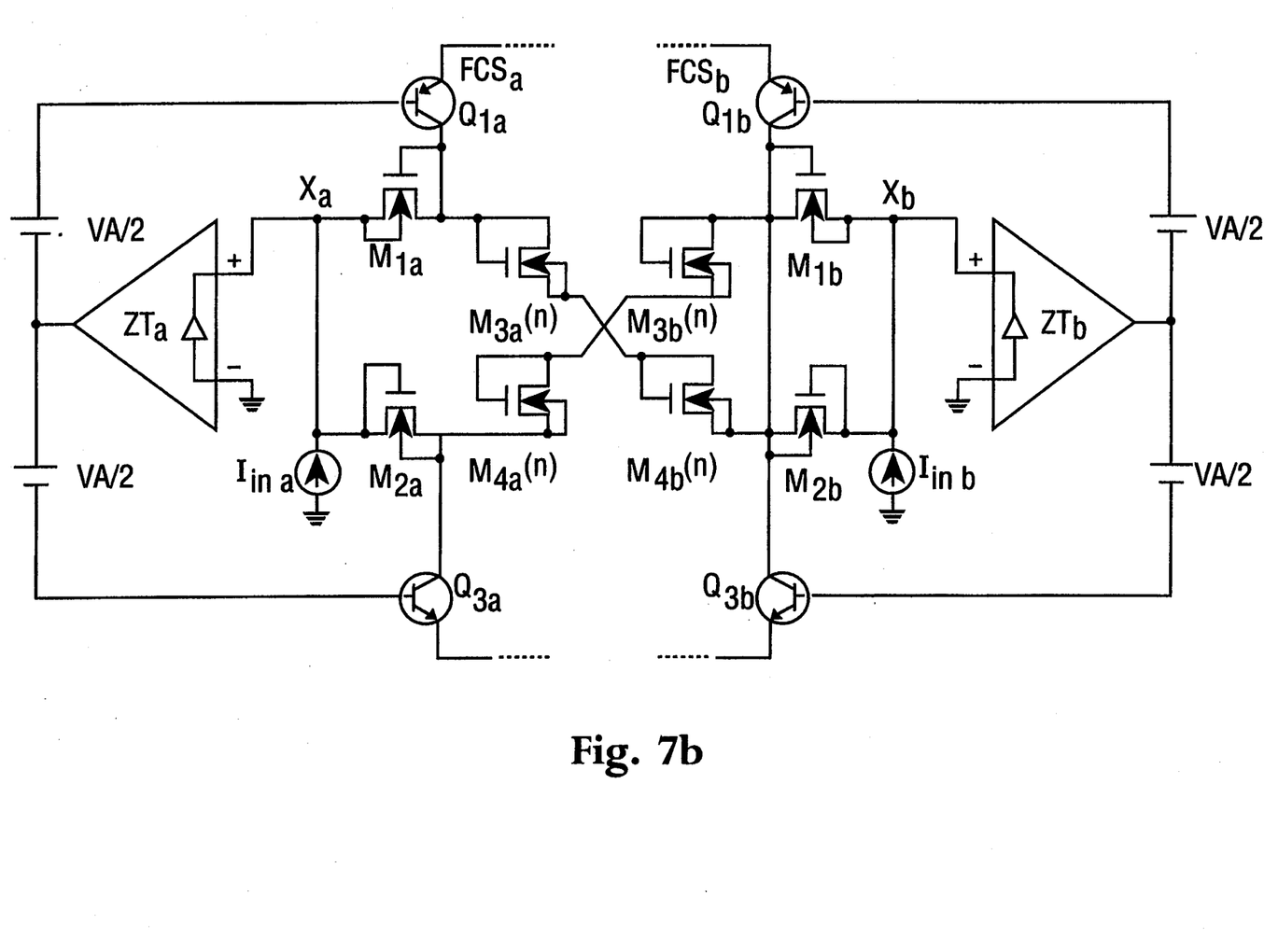
FIG. 7b shows a feedback network of the kind employed in FIG. 5b, modified to be employed with a differential CMA.

The two FCS output stages feeding the feedback netweork as shown in FIGS. 7a and 7b may also be replaced by two CCII-'s, as shown in FIGS. 6a and 6b for a single ended CMA. The resulting circuit is not shown in a separate drawing.

It will be appreciated by persons skilled in the art, that the present invention is not limited to what has been particularly shown and described hereinabove. Rather the scope of the present invention is defined only by the claims which follow.

What is claimed is:

1. A feedback network for use with a suitable basic amplifier, said feedback network substantially consisting of a plurality, n+1, of identical non-linear devices, n of which are connected in parallel, to provide a linear feedback stabilized gain of n+1.

2. The feedback network of claim 1 wherein said basic amplifier is a CMA (current mode amplifier) which comprises:
   a) an amplifier having a substantially infinite gain, and having first and second input terminals, and a voltage output terminal;
   b) an input current source connected to the first input terminal of said amplifier;
   c) a current output stage (COS) having a first and a second input voltage terminal and a first and a second output current terminal;
   d) an electrical connection between said first input terminal and said voltage output terminal of said amplifier providing voltage for driving the COS;
   e) said second input voltage terminal of said COS being connected to ground; and
   f) an electrical load connected between the second output current terminal of said COS and ground.

3. The feedback network according to claim 2 comprising: a first non-linear device which is connected between said first input terminal of said amplifier and said first output current terminal of said COS, and n non-linear devices electrically identical to said first non-linear device which are connected in parallel between said first output current terminal of said COS and ground.

4. The feedback network of claim 2 wherein said amplifier is a transimpedance amplifier.

5. The feedback network of claim 2 wherein said amplifier is a voltage amplifier.

6. The CMA of claim 2, wherein:
   said COS is a class-II current conveyor (CCII-) and wherein said feedback network comprises a single non-linear device connected between said first input terminal of said amplifier and said first output current terminal of said CCII-, and n non-linear devices, identical to said single non-linear devices, connected in parallel between said first output-current terminal of said CCII- and ground.

7. The CMA of claim 2, wherein:
   said COS is a floating current source (FCS) and wherein said feedback network comprises a single non-linear device connected between said first input terminal of said amplifier and said first output current terminal of said FCS, n non-linear devices, identical to said single non-linear devices, connected in parallel between said first output current terminal of said FCS and ground.

8. The feedback network according to claim 1 wherein said n+1 identical non-linear devices are active elements.

9. The feedback network of claim 1, wherein said basic amplifier has a substantially infinite gain and comprises an amplifier having an input terminal and an output terminal, and an output stage connected to said output terminal of the amplifier, said output stage providing a connection to said feedback network and to a load.

10. The feedback network of claim 9 comprising a first non-linear device which is connected between said input terminal of said amplifier and said output stage, and n non-linear devices electrically identical to said first non-linear device which are connected in parallel between said output stage and ground, to provide a linear gain of n+1.

11. The feedback network according to claim 10 wherein said non-linear devices are transistors.

12. An amplifier having a linear feedback stabilized gain of "n+1" comprising:
a differential CMA comprising a pair of "Single Ended" CMA's and
a feedback network comprising a plurality 2×(n+1) of non-linear devices 2×n of which are connected in parallel to linearize the gain of the differential amplifier.

13. An amplifier having a linear feedback stabilized gain of "n+1" comprising:
a differential CMA comprising a pair of "Single Ended" CMA's and
a feedback network comprising two branches of a plurality 2×(n+1) of non-linear devices 2×n of which are connected in parallel to linearize the gain of the differential amplifier.

14. A feedback network for use with a basic amplifier, said feedback network substantially consisting of a plurality, n+1, of identical non-linear devices, n of which being connected in parallel, to provide a gain of n+1 which is substantially independent of frequency.

15. A feedback amplifier comprising a current mode amplifier (CMA) comprising:
a) an amplifier having a substantially infinite gain and having first and second input terminals and a voltage output terminal;
b) an input current source connected to the first input terminal of said amplifier;
c) a modified FCS current output stage having a first and a second input voltage terminal and a first and a second output current terminal said second output terminal, said first output terminal having two outputs;
d) an electrical connection between said first input terminal and said voltage output terminal of said amplifier providing voltage for driving the FCS;
e) said second input terminal of said FCS being connected to ground; and f) an electrical load connected between the second output current terminal of said FCS and ground; and g) a feedback network comprising two branches, each being connected to one of said two outputs for causing said two feedback branches to have currents of opposite polarities flowing from the two terminals ensuring that the current in each branch maintains its polarity while the current flowing out of the second output terminal and into the electrical load changes from a maximum negative to a maximum positive value wherein each said branch comprises a single non-linear, unidirectional device which is connected between the first input terminal of said amplifier and one of the two outputs of the first output current terminal and a plurality "n" of parallel connected non-linear unidirectional devices identical to the single non-linear, unidirectional device, said parallel connected devices being connected between one of the two outputs and ground.

16. A feedback amplifier comprising a current mode amplifier (CMA) comprising:
a) an amplifier having a substantially infinite gain and having first and second input terminals and a voltage output terminal;
b) an output current source connected to the first input terminal of said amplifier;
c) a modified CCCI- current output stage having a first and a second input voltage terminal and a first and a second output current terminal said second output terminal, said first output terminal having two outputs;
d) an electrical connection between said first input terminal and said voltage output terminal of said amplifier providing voltage for driving the CCCI;
e) said second input terminal of said CCCI being connected to ground; and
f) an electrical load connected between the second output current terminal of said CCCI and ground; and
g) a feedback network comprising two branches, each being connected to one of said two outputs for causing said two feedback branches to have currents of opposite polarities flowing from the two terminals ensuring that the current in each branch maintains its polarity while the current flowing out of the second output terminal and into the electrical load changes from a maximum negative to a maximum positive value wherein each said branch comprises a single non-linear, unidirectional device which is connected between the first input terminal of said amplifier and one of the two outputs of the first output current terminal and a plurality "n" of parallel connected non-linear unidirectional devices identical to the single non-linear, unidirectional device, said parallel connected devices being connected between one of the two outputs and ground.

* * * * *